United States Patent [19]

Hyder

[11] 4,415,766
[45] Nov. 15, 1983

[54] RECOGNIZER/CONVERTER FOR ARABIC AND OTHER LANGUAGE CODES

[75] Inventor: Syed S. Hyder, Westmount, Canada

[73] Assignee: Alephtran Technology N.V., Curacao, Netherlands Antilles

[21] Appl. No.: 157,296

[22] Filed: Jun. 6, 1980

[51] Int. Cl.³ .............................................. H04L 3/00
[52] U.S. Cl. ..................................... 178/30; 178/26 R
[58] Field of Search ...................... 178/17.5, 26 R, 30; 400/109, 110, 111; 364/518, 519; 340/347 DD

[56] References Cited

U.S. PATENT DOCUMENTS

| | | | |
|---|---|---|---|
| 4,006,463 | 2/1977 | Hanks | 178/26 R |
| 4,145,570 | 3/1979 | Diab | 178/30 |
| 4,192,010 | 3/1980 | Kerner et al. | 340/347 DD |
| 4,200,769 | 4/1980 | Heinzl | 400/111 |
| 4,251,871 | 2/1981 | Yu | 178/30 |

Primary Examiner—Gerald L. Brigance
Attorney, Agent, or Firm—Schwartz, Jeffery, Schwaab, Mack, Blumenthal & Koch

[57] ABSTRACT

The invention relates to a code converter with the specific capability of converting certain predetermined combinations of two or more code words of a first coding system to a single code word of a second coding system. The invention also relates to a converter with means for recognizing the combination, and to the recognizer per se. In a specific application, the converter system is for converting code words of a presently existing coding system, which are representative of characters in the Arabic-Farsi languages, and all languages written in Arabic scripts, to code words of a second coding system. The Arabic-Farsi languages include special characters, which comprise an overdot and an undercharacter, and each of these special characters is represented by two code words. The converter compresses the two code words to a single respective code word. The converter includes a recognizer to recognize the code words for the special characters, and a converting circuit for converting the two code words representative of respective ones of the special characters to a single respective code word.

4 Claims, 8 Drawing Figures

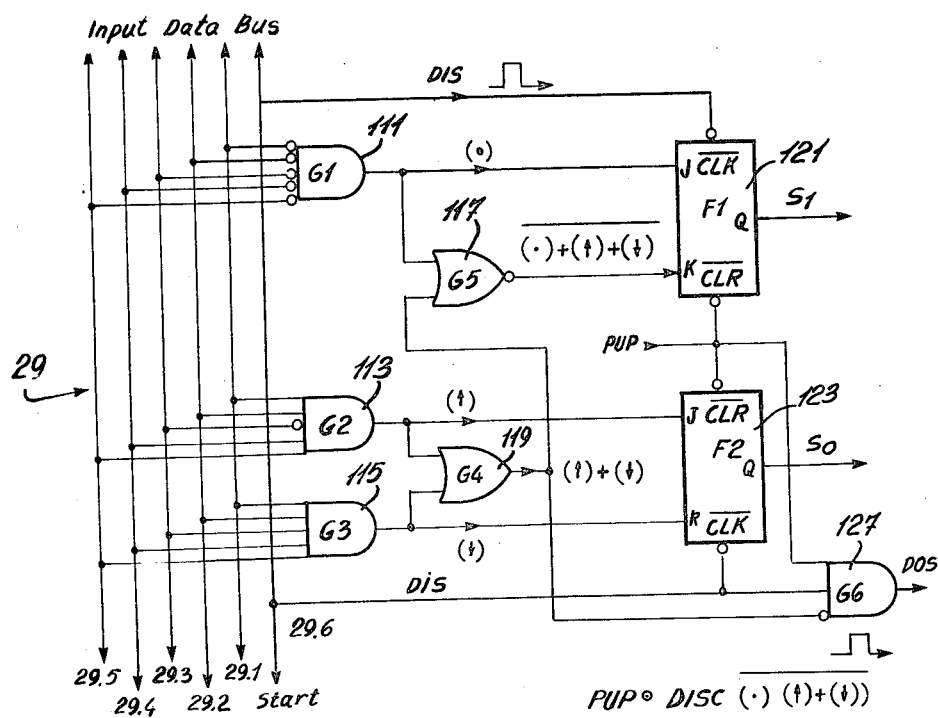

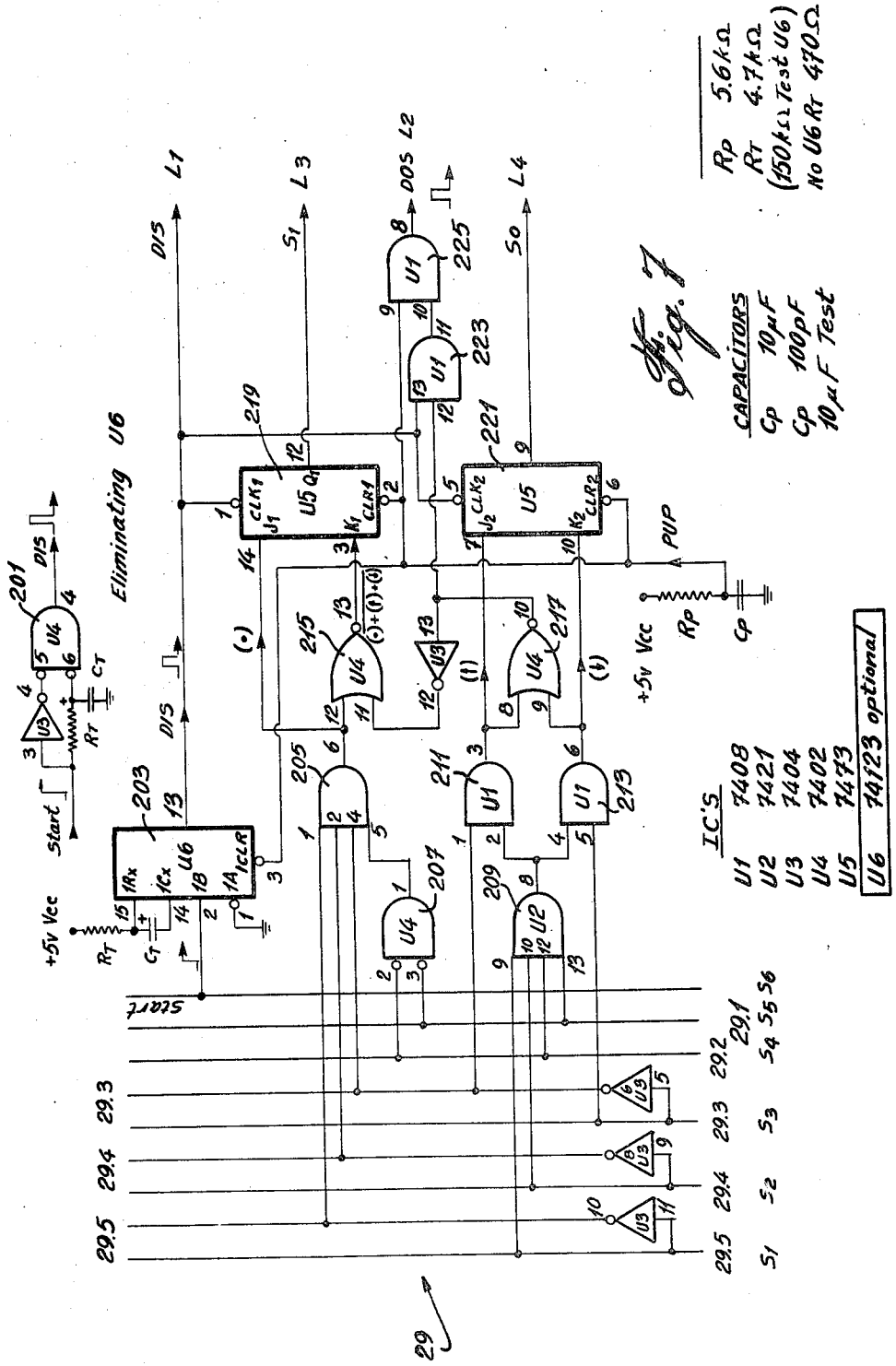

RECOGNIZER/CONVERTER FOR ARABIC AND OTHER LANGUAGE CODES

BACKGROUND OF INVENTION (a) Field of the Invention

The invention relates to a code converter with the specific capability of converting certain predetermined combinations of two or more code words of a first coding system to a single code word of a second coding system. The invention more specifically relates to such a converter which includes means for recognizing the predetermined combinations.

In a specific embodiment, the invention relates to a code converter for converting certain Arabic language characters, presently requiring two code words, of a first coding system, for the representation thereof, to a single code word of a second coding system. More specifically, the invention relates to such a converter which includes means for recognizing the certain characters. The invention also relates to the recognizer means per se.

(b) Description of Prior Art

The machine writing and printing of the Arabic/Farsi/Urdu etc. scripts is complicated by the fact that the shape of each alphabetic character is determined by its position in the text, i.e., isolated and in a word, i.e., initial, medial and terminal. In handwritten cursive script, this presents no particular problem but in machine writing and printing a processor is required that makes the correct choice of shape of each character. This processor releases the correct shape required as soon as the one that follows it is signalled. The processor makes it possible to generate faultless text using only one key for each alphabetic character, i.e., two key, in the case of certain Arabic characters.

Methods and apparatus for such processing are taught in, for example, U.S. Pat. No. 3,938,099, Hyder, issued Feb. 10, 1976 and U.S. Pat. No. 4,145,570, Diab, issued Mar. 20, 1979.

There are also six special characters in the Arabic languages which require special attention. The six characters are illustrated as items 33 to 38 in FIG. 8 of the Diab Patent. The characters are also illustrated in FIG. 9A of the same patent. The six characters consist of an overdot and an undercharacter. The undercharacter, illustrated in FIG. 9B of the Diab patent, can stand alone as entirely different and separate characters from the special overdot characters.

In the Diab patent, codes for representing the special characters consist of two separate code words. The first of the code words in each of the special characters consists of a code word to identify the overdot. The second code word corresponds with the code word for the undercharacter of the special character. In reproducing the special character on a teleprinter, the code word for the overdot is first applied to the teleprinter whereupon the teleprinter prints the overdot and retains the carriage in a stationary position. The undercharacter is then printed so that the undercharacter will be printed below the overdot to produce the special character.

It can therefore be seen that each of the special characters requires two code words for the representation thereof. Thus, each of the special characters is not separately represented by a unique code word.

Such a pseudocode is not acceptable with the newest generation of teleprinters and data terminals which require that each character be represented by a unique, discrete and single code word. It is contemplated that such teleprinters will have text editing capability in the local memory of the teleprinters so that texts can be corrected before they are transmitted. In addition, having a discrete code for each character also simplifies tape preparation.

In addition, the growing use of computers together with teleprinters for text processing, storage and retrieval requires a consistent code representation scheme where all characters of language are treated uniformly. A code system having discrete codes for a majority of characters with six characters represented by a dot code followed by another code is both inconsistent and difficult to use in this environment.

It is therefore desirable to design a new code which is consistent and in which each character can be treated uniformly. Thus, in the new code, the six characters would be represented by a single code word. The new code would then be processed by a machine, such as described in the Hyder patent above, to determine the specific shape that each character should take depending on the position of that character in a word and the following preceding characters.

However, it is perhaps unreasonable to assume that once such a new code is designed and machines are designed to go with the code, that the whole world will immediately switch over to the new code and the new machine. It would therefore be necessary for the new machines to have the facility to handle codes transmitted by the present generation of machines. This facility could be provided by a code converter which would convert the present generation code to the new code, and which would especially convert the two word code of the special characters to the single word code.

OBJECTS OF THE INVENTION

It is therefore an object of the invention to insure compatibility of the present day codes with a proposed new code.

It is a more specific object of the invention to provide a code converter for converting present day codes to a proposed new code.

It is an even more specific object of the invention to provide a code converter which will convert a two or more word code to a single word code.

It is an even more specific object of the invention to provide a converter which includes a recognizer for recognizing the special characters represented by the two or more word codes.

It is an even more specific object of the invention to provide a code converter which will convert a two word code to a single word code.

It is an even more specific object of the invention to provide a converter which includes a recognizer for recognizing the special characters represented by two word codes.

SUMMARY OF THE INVENTION

In accordance with a specific embodiment, there is provided a converter for converting each one of a predetermined combination of two or more code words of a first coding system, to a single code word of a second coding system; said converter comprising: means for recognizing said predetermined combinations of code words of said first coding system; and means for converting each of said predetermined combinations to a respective single code word of the second coding system.

In accordance with a more specific embodiment, there is provided a converter system for converting code words of a first coding system, representative of characters in the Arabic-Farsi languages, to other code words of a second coding system, said Arabic-Farsi languages comprising special characters, each represented by two code words in said first coding system; said converter comprising: means for recognizing the code words representative of said special character; and means for converting each of the two code words representative of a respective one of the special characters to a single code word of the second coding system respectively representative of the special characters.

From a different aspect, and in accordance with the invention, there is provided, in a system for recognizing codes representative of any one of a first, second, third or fourth conditions, and for recognizing transitions between selected ones of said conditions, and for providing a first output signal and a second output signal representative of said conditions and said transitions, the improvement wherein said system is provided with a transition from said first condition to said second condition comprising a first change in state in said second output signal, a transition from said third condition to said fourth condition comprising a second change in state in said second output signal, a transition from said first condition to said third condition comprising a first change in state in said first output signal, and a transition from said second condition to said fourth condition comprising a second change in state in said first output signal.

In accordance with a further embodiment, there is provided a system for recognizing codes representative of any one of a first, second, third or fourth conditions, and for recognizing transitions between selected ones of said conditions, and for providing a first output signal and a second output signal representative of said conditions and said transitions; said system comprising: a first circuit for recognizing the code representative of said first condition and the code representative of said second condition and for providing a first output signal being in one of two states, and for providing a first state of said first output signal when said first condition is recognized and a second state of said first output signal when said second condition is recognized; a second circuit for recognizing the code representative of said third condition and the code representative of said fourth condition and for providing a second output signal being in one of two states, and for providing a first state of said second output signal when said third condition is recognized, and a second state of said second output signal when said fourth condition is recognized; the transition from said first condition to said second condition comprising a change in state in said second output signal; the transition from said third condition to said fourth condition comprising a change in state in said second output signal; a transition from said first condition to said third condition comprising a change in state in said first output signal; and the transition from said second condition to said fourth condition comprising a change in state in said first output signal.

BRIEF DESCRIPTION OF THE DRAWINGS

The invention will be better understood by an examination of the following description together with the accompanying drawings in which:

FIG. 3 is a transition matrix, which gives the outputs and states, corresponding to the transition graph in FIG. 2;

FIG. 4 is a logic diagram of the recognizer circuit;

FIG. 7 is a specific embodiment of the logic diagram illustrated in FIG. 4 above.

FIG. 8 represents the figures and letters of the Arabic alphabet and number set which, when overprinted by a point, represent further characters which are not available in the CCITT code.

DESCRIPTION OF PREFERRED EMBODIMENTS

In the specific case of the Arabic-Farsi language application, the recognizer circuit must be capable of distinguishing four classes of code words as follows:

1. The code word for an overdot.
2. The code word for an upper register shift.
3. The code word for a lower register shift.
4. Code words for numerals and characters not in the above three classes.

When the recognizer recognizes code words in the last three classes, it will either pass them to a first conversion circuit or directly to the teleprinter as will be discussed below. When it recognizes an overdot, then the converter must compare the code word following the overdot to determine whether the two code words (the overdot and the following character) are really representative of one of the six special characters. If they are, a further conversion circuit will convert the two code words into a corresponding single code word.

Figure 1:
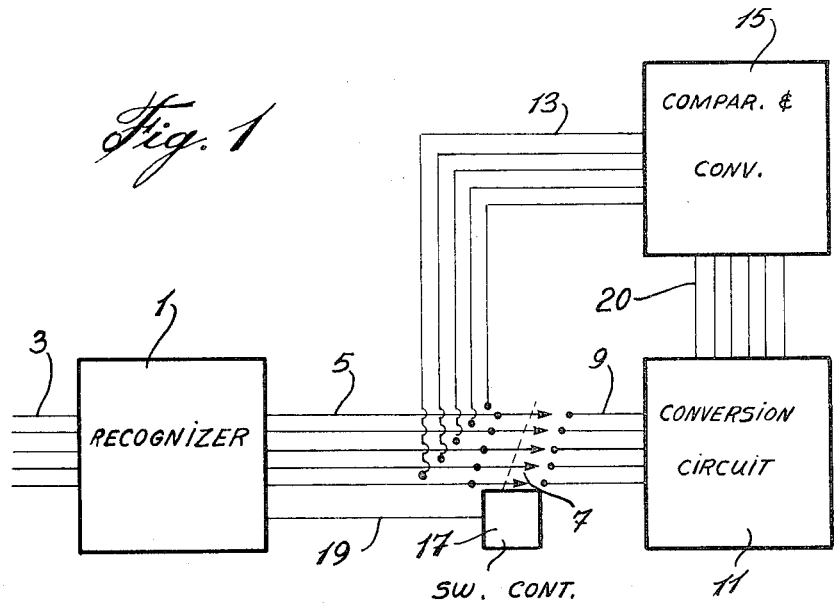
FIG. 1 is a schematic block diagram of a converter in accordance with the invention.

The block diagram for this is illustrated in FIG. 1. In FIG 1, the recognizer 1 is fed with the data of code words representing a message by bus 3 whic, in this case, is illustrated as a 5 bit bus. It will of course be appreciated that the inventive idea in the invention herein could be used with a greater number or a lesser number of bits. However, present day communication of networks use 5-level Boudot=CCIT=number 2 code, so that FIG. 1, and the remainder of the figures herein, assume a 5 bit code. However, the number of bits in the code is not critical to the invention and the 5 bit code is used only for illustrative purposes.

The output of the recognizer is carried on bus 5 to switching arrangement 7. The switching arrangement, depending on the position of the switches, will then divert the data either, via bus 9, to conversion circuit 11, or, via bus 13, to comparator and conversion circuit 15. The switch is controlled by switch control means 17. Switches 7 and switch control means 17 are well known in the art and require no further description.

Assuming now that the recognizer recognizes the code word for an overdot, it will then provide an output on line 19 to switch control 17 to manipulate the switch so that data will flow along bus 5 to bus 13 and to comparator and converter 15. The next code word (following the overdot code word) is then fed to the means 15 which would include in its memory the undercharacters illustrated in FIG. 9B of the Diab patent above. If the next character corresponds with one of the characters in memory, then it is known that the two code words representing the overdot and the following character are representative of a single overdot character of the type illustrated in FIG. 9A of the Diab patent. In this case, the means 15 would provide a single word code corresponding to that particular overdot character. When the following character is transmitted, a further signal could be provided on line 19 so that switch control means will manipulate the switch 7 to replace it in the position shown in FIG. 1.

When the recognizer recognizes instead a code word of any one of the last three classes above enumerated, the switch will remain in the position indicated in FIG. 1 so that the code word will be transmitted directly to the conversion circuit 11.

It is possible that the new code will be identical in all respects to the presently existing code except that the six special characters will be represented by six unique and distinct words instead of two code words each. In that case, a conversion circuit will not be required and all of the code words which are not overdots would be transmitted directly to a teleprinter. However, if there are other changes, then the conversion circuit 11 would be needed to implement these other changes.

Figure 2:
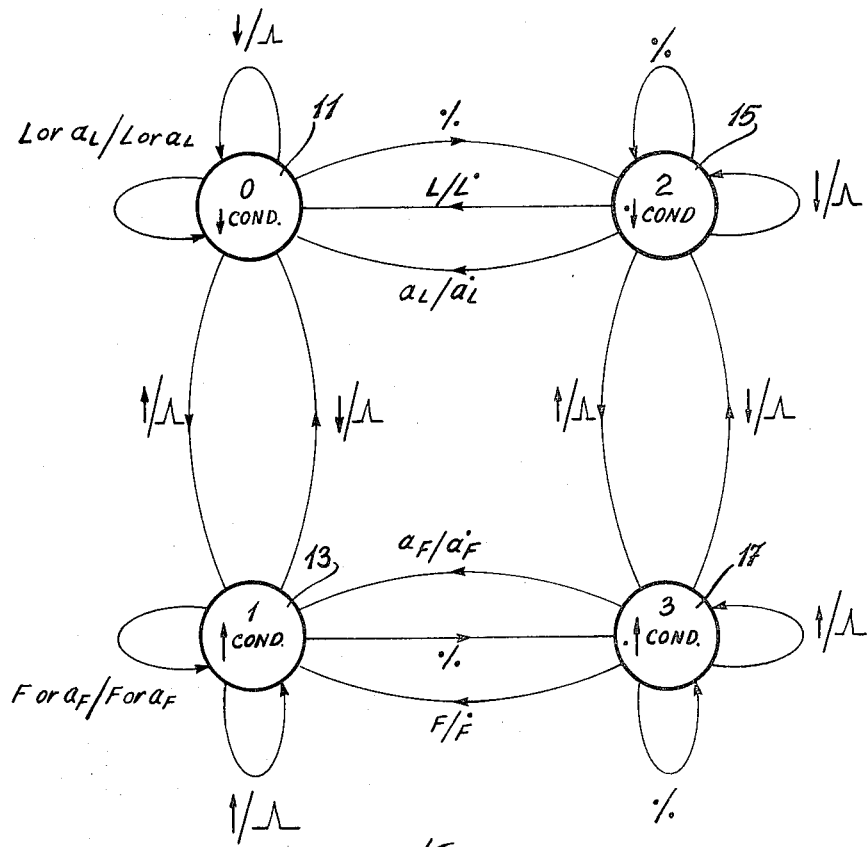
FIG. 2 is a transition graph to be implemented by the recognizer circuit.

The recognizer will also be required to recognize four different states, as illustrated in FIG. 2 herein, and the transitions from one of these states to another one.

Turning now to FIG. 2. The circles 11, 13, 15 and 17 represent four different states into which the teleprinter would be set by the coded inputs. Circle 11 is a lower register stage, circle 13 is an upper register state, circle 15 is a lower register state with an overdot, and circle 17 is an upper register state with an overdot. The lines between circles represent transitions from one state to another, and the input/output beside these transition lines indicates the input leading to the transition and the output resulting from the transition.

The definition of the output terms used in FIG. 1 are as follows:

1. Input Alphabet A: CCITT No. 2 for Arabic.
 $a_F$: The set of Arabic character forms found in figures row of the CCITT code, which when overprinted by a point viz; $\dot{a}_F$ represents the set of shapes that are not available in CCITT code.
 See FIG. 8, row 1.
 F: The set of figures and letters found in the figure row of above code, excluding the set $\dot{a}_F$.
 $a_L$: The set of Arabic characters forms found in the letters row of CCITT code, which when overprinted by a point vis: $\dot{a}_L$ represent the set of shapes that are not available in that code.
 see FIG. 8, row 2.
 L: The set of letters found in the letters row of the above code excluding the set $\dot{a}_L$.
 ↑ : Figures shift, code position 4, 5-30
 ↓ : Letters shift, code position 4, 5-29
 • : Dot in figure letters position 4, 5-32

We summarize that the input alphabet A can be written as:

$$\{L, a_L, F, a_F, \uparrow, \downarrow, \bullet\}$$

2. State set Q: {state#0, ..., state #3}
3. Output set: {A, $\dot{a}_L$, $\dot{a}_F$}
4. The transition function $\delta$ is given on the transition matrix (FIG. 3).
5. The output function $\lambda$ is given by the transition matrix (FIG. 3).

In the above, the letters row refers to the lower register of the teleprinter, and the figures row refers to the upper register thereof. To understand better the meaning of FIG. 2, we will consider the outputs and transitions which result when the teleprinter receives an input signal when it is in the 0 state, i.e. circle 1:

If the input is a letter, then the output will be that same letter, and the state will not change;

If the input is an upper register shift signal, then there is no output, however, there is a transition from state 0 to state 1 (circle 1 to circle 3);

If the input is an overdot, then the output will also be an overdot, and there is a transition from state 0 to state 2 (circle 1 to circle 5); and If the input is a lower register shift signal, then there is no output and there is no change of state. (This latter signal is, of course, unnecessary as the teleprinter would already be in the lower register state. However, such a signal may be an operator input error).

It is pointed out that it is not possible, when a machine is in the lower register, to have a figure input as the figures are all presumed to be in the upper register.

Considering now the outputs and transitions resulting from different inputs when we are in state 2;

If there is an overdot input, then the output is an overdot and there is no change in state;

If there is a letter of the type L input, then the output is a letter of the type L with an overdot, and there is a transition from state 2 to state 0;

If there is an upper register shift signal input, then there is no output, and there is a transition from state 2 to state 3;

If there is a lower register shift input signal, once again, there is no output and there is no change in state; and If the input is a letter of the type $a_L$, then the output is the same letter with an overdot, and there is a transition from state 2 to state 0. The letter $a_L$ with a dot on top of it is, of course, one of the special characters referred to above.

The remainder of the diagram uses the same symbols and the foregoing can be understood by an examination thereof together with an understanding of the foregoing. Once again, the letters of the type $\dot{a}_F$ are of the special characters referred to above.

The transition matrix of FIG. 3 contains the same information as the transition graph of FIG. 2 and is just a different way of presenting the same information. An analysis of the matrix of FIG. 3 will, of course, indicate the same results as the above analysis.

Turning now to FIG. 4, the input data bus, shown generally at 29, includes input lines 29.1 to 29.5 and start signal input line 29.6. The model includes three AND gates 111, 113 and 115 and two OR gates 117 and 119. Output signals are provided from the Q terminals of JK flip-flops 121 and 123 having J and K input terminals. AND gate 127 provides a data output strobe (DOS). A data input strobe (DIS) is provided to the clock terminals of both the JK flip-flops and to gate 127 from input line 29.6. A power-up (PUP) is provided to the clear terminals of both JK flip-flops and to an input to gate 127 to provide unambiguous low outputs $S_o$ and $S_1$ and DOS initially, after the device is switched on.

Gate 111 has inverted inputs at all of its terminals, and gate 113 has an inverted input at its third terminal. Accordingly, it will be clear that the code for an over-dot is 00000, and the signal for an upper register shift is 11011. The signal for a lower register shift is 11111.

The following is a summary of inputs and outputs in the logic model:

The functional modules include:

1. Input Decoder, consisting of logic gates G1, G2, G3, G4 and G5,
2. Output State Scaler, consisting of master/slave J-K flip-flops F1 and F2,
3. Control Signal Synthesizer, consisting of logic gate G6, and
4. Power Up circuit, consisting of a resistor and capacitor which provides PUP=0 for a short period after power is switched on. This signal, applied to the $\overline{CLR}$* inputs of F1, F2 and G6, clears $S_o = S_1 = 0$ and suppresses the DOS pulse.

* $\overline{CLR}$ ... not CLeaR

Modules 1., 2. and 3. will be described in detail.

Input Decoder (a) Gate G1 provides the signal (•), to set $S_1 = 1$, to J-K flip-flop F1 when $29.1 = 29.2 = 29.3 = 29.4 = 29.5 = 0$.

(b) Gate G2 provides the signal ($\uparrow$), to set $S_o = 1$, to J-K flip-flop F2 when $29.1 = 29.2 = 29.4 = 29.5 = 1$ and $29.3 = 0$ (c) Gate G3 provides the signal ($\downarrow$), to clear $S_o = 0$, to J-K flip-flop F2 when $29.1 = 29.2 = 29.3 = 29.4 = 29.5 = 1$.

(d) Gate G4 provides the signal ($\uparrow$)+($\downarrow$) to the input of gate G5 and also to the input of gate G6 so as to suppress DOS when either ($\uparrow$)=1 or ($\downarrow$)=1.

(e) Gate G5 provides the signal $\overline{(\bullet) + (\uparrow) + (\downarrow)}$, to clear $S_1 = 0$, to J-K flip-flop F1 when $\overline{(\bullet)}$ $\overline{(\uparrow)}$ $\overline{(\downarrow)} = 1$.

Output State Scaler (a) Master/slave J-K flip-flop F1 accepts and stores the outputs of G1 and G5 as inputs on $\int$ (rising edge of signal transition) of DIS. Its output Q defines the transitions of $S_1$ of $\bar{L}$ (falling edge of signal transition) of DIS, according to the table below. If PUP=0 then $S_1 = 0$, unconditionally.

| | Input Before ($\int$) of DIS | Output After ($\bar{L}$) of DIS | |
|---|---|---|---|
| PUP | (·) | (·) + ($\uparrow$) + ($\downarrow$) | $S_1$ |
| 0 | X | X | 0 | |
| 1 | 0 | 0 | No change | |
| 1 | 0 | 1 | 0 | F1 |
| 1 | 1 | 0 | 1 | |
| 1 | 1 | 1 | Impossible | |

(b) Master/slave J-K flip-flop F2 accepts and stores the outputs of G2 and G3 as inputs on $\int$ of DIS. Its output Q defines the transitions of $S_o$ on $\bar{L}$ of DIS, according to the table below. If PUP=0, then $S_o = 0$, unconditionally.

| | Input Before ($\int$) of DIS | Output After ($\bar{L}$) of DIS | |
|---|---|---|---|
| PUP | ($\uparrow$) | ($\downarrow$) | $S_o$ |
| 0 | X | X | 0 | |
| 1 | 0 | 0 | No change | |
| 1 | 0 | 1 | 0 | F2 |
| 1 | 1 | 0 | 1 | |
| 1 | 1 | 1 | Impossible | |

Control Signal Synthesizer (a) Gate G6 translates the pulse DIS into the pulse DOS if the output of the gate G4, ($\uparrow$)+($\downarrow$)=0, is low, indicating that the code on the input data bus is neither a "figures shift", ($\uparrow$), nor a "letters shift," ($\downarrow$), and the power up signal, PUP=1, is present.

As can be seen, when an upper register shift signal is applied, $S_o$ is set to 1, and when a lower register shift signal is applied, $S_o$ is set to 0. At the same time, when an overdot code is received, $S_1$ is set to 1, and when a code which does not represent either an overdot or an upper register shift or a lower register shift, i.e., it represents either a number or a letter, is received, then $S_1$ is set to 0.

Considering now how the model implements the transition graph of FIG. 1, consider first the condition when the teleprinter is in state 0, i.e., in the lower register. If the next code received is an upper register shift signal (11011), then $S_o$ is set to 1 to effect a transition from state 0 to state 1. There will not be any output on the teleprinter.

If, instead, the input is a letter, (i.e. it is not an overdot or an upper register shift signal or a lower register shift signal) then $S_1$ is set to 0, the letter is printed, and there is no change in state. If the input is a lower register shift signal, then there is no change in the state of $S_o$, and there is no output. Finally, if the data input is for an overdot (00000), then $S_1$ is set to 1, the overdot is printed, and the state is changed to state 2.

Considering now the starting state as being state 2, i.e., lower register with an overdot, the following outputs and transitions will occur as a result of the following respective inputs:

If the input is an overdot, then the state of $S_1$ will not change and the state of $S_o$ will similarly not change. Accordingly, the overdot will be printed but the state will remain the same.

If the input is a lower register shift position, then the state will, once again, remain the same and there will not be any output.

If the input is an upper register shift signal, then the state of $S_o$ will change from 1 to 0 so that there will be a transition from state 2 to state 3. However, this input will not produce any output.

Finally, if the input is a letter, then the state $S_1$ will change from 1 to 0 so that there is a change of state from 0 to 2. In this case, the letter will be printed under the dot as shown in FIG. 1.

In the latter case, we are, of course, not dealing with one of the six special characters. Accordingly, referring to FIG. 1, the data word will be passed, via bus 20, to conversion circuit 11 for treatment in the normal fashion.

A similar analysis starting at any of the four states in FIG. 4 and applying all of the inputs will indicate that all of the states and transitions illustrated in FIGS. 2 and 3 are implemented with the logic model illustrated in FIG. 4.

Figure 5:
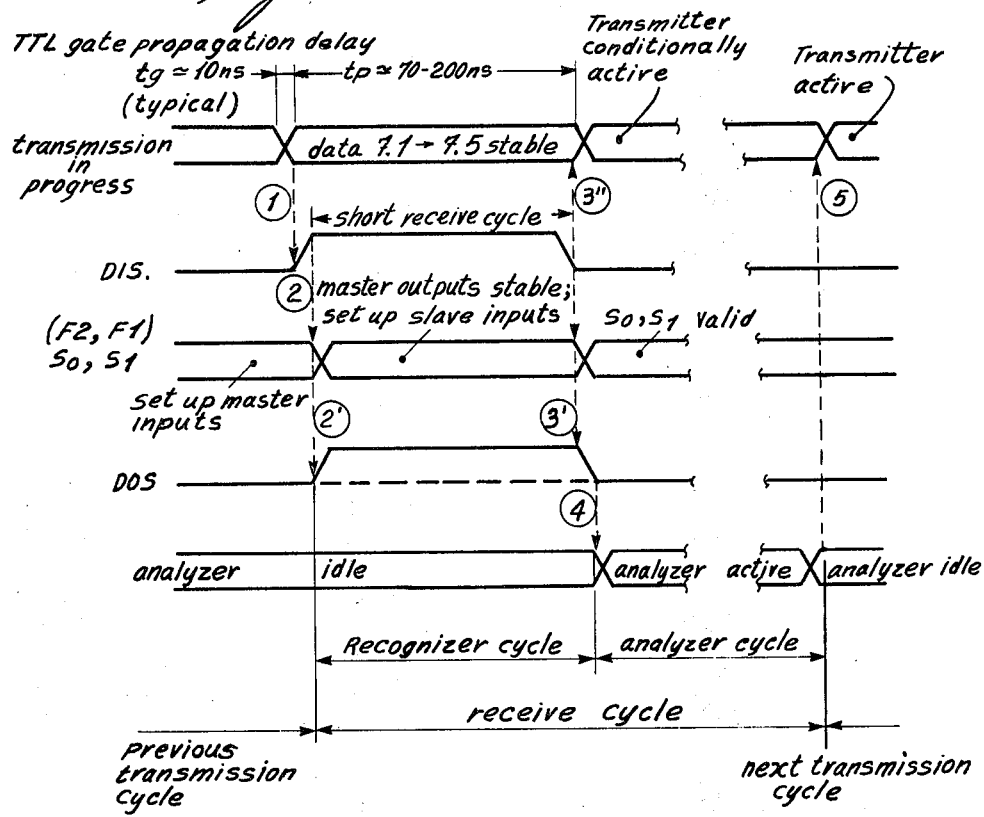
FIG. 5 is a timing diagram of the recognizer circuit.
Figure 6:
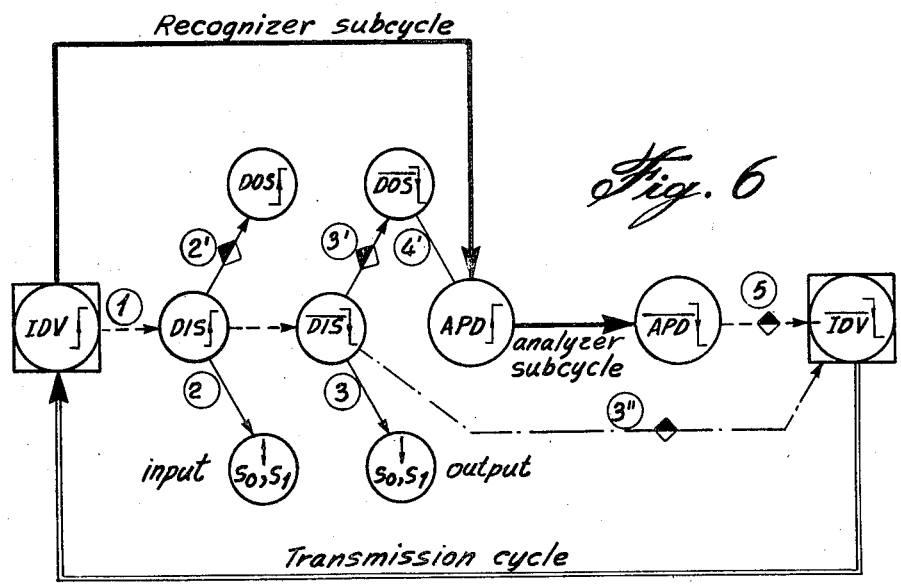
FIG. 6 is a timing tree corresponding with the timing diagram of FIG. 5.

The "recognizer" can be concisely described as an unambiguously self-starting, 2-bit synchronous (clocked by DIS) scaler with gated inputs (29.1-29.5), augmented by a conditionally inhibitable output strobe (DIS-DOS). FIG. 5 is a timing diagram which depicts a sequence of ten signal transitions which represent events, important in the context of the recognizer cycle. FIG. 6 is a graph showing predecessor/successor inter-relationships among signal transition events more explicitly than does the timing diagram. The sloping transitions in FIG. 5 represent gate propagation delays. The horizontal, time, axes of FIGS. 5 and 6 are not to scale. A specific embodiment of FIG. 7, was timed, by appropriate choice of the parameters $R_T$ and $C_T$, so that the pulses DIS and DOS are about 0.1s in duration and the operation of this "recognizer," carried out with manually operated switches on the inputs and indicator lights on the outputs, can be observed visually, without instruments. In actual operation, this embodiment would have resistor, $R_T$, and the capacitor, $C_T$, selected so that these pulse durations are in the 50-200 ns range.

A specific embodiment of the logic model is illustrated in FIG. 7. Referring to FIG. 7, the data input bus is once again referred to generally as 29. In the prototype implementation, inversions of the third, fourth and fifth input lines are also provided.

The DIS is provided either by the circuit illustrated generally at 201 or by the circuit illustrated generally at 203. The function of gate 111 in FIG. 4 is implemented by gates 205 and 207 in FIG. 7, and the function of gate 113 is implemented by gate 209 and 211. The function of gate 115 is implemented by gates 209 and 213, and the function of gate 117 is implemented by gate 215 while the function of gate 119 in FIG. 4 is implemented by gate 217. Flip-flop 119 in FIG. 4 corresponds with flip-flop 21 in FIG. 2, and flip-flop 21 in FIG. 7 corresponds with flip-flop 123 in FIG. 4. The function of gate 127 is implemented by gate 223 and 225 in FIG. 7. Specific IC's, resistor and capacitor values are listed in FIG. 7, and the operation of the FIG. 7 prototype is, of course, similar to the operation of the FIG. 4 logic model.

Although FIG. 7 illustrates a parallel logic diagram, it will of course be clear to one skilled in the art that the same results could be accomplished by serial logic and an appropriate serial logic circuit arrangement. Such a serial logic arrangement is within the design scope of one skilled in the art and is therefore not further discussed here.

Although the above description related to a specific application, it will be recognized that there are other coding situations wherein it is required that predetermined combinations of two or more code words in a first coding system must be converted to a single code word in a second coding system. For example, the French, German and Swedish languages use vocalization guides on certain letters (e.g. accents in French and umlauts in German and Swedish). The present invention could be applied in the cases of these languages as well. Once again, a recognizer would be an integral part of the converter.

Although specific embodiments have been above-described, this was for the purpose of illustrating, but not limiting, the invention. Various modifications, which will come readily to the mind of one skilled in the art, are within the scope of the invention as defined in the appended claims.

I claim:

1. A system for recognizing codes representative of any one of a first, second, third or fourth conditions, and for recognizing transitions between selected ones of said conditions, and for providing a first output signal having a first and second state and a second output signal having a first and second state representative of said conditions and said transitions;

said system comprising:

a first circuit for recognizing the code representative of said first condition and the code representative of said second condition, and for providing a first state of said first output signal when said first condition is recognized and a second state of said first output signal when said second condition is recognized;

a second circuit for recognizing the code representative of said third condition and the code representative of said fourth condition, and for providing a first state of said second output signal when said third condition is recognized, and a second state of said second output signal when said fourth condition is recognized;

the transition from said first condition to said second condition comprising a first change in state in said second output signal;

the transition from said third condition to said fourth condition comprising a second change in state in said second output signal;

a transition from said first condition to said third condition comprising a first change in state in said first output signal; and the transition from said second condition to said fourth condition comprising a second change in state in said first output signal.

2. A system as defined in claim 1 and comprising a data bus, and having a plurality of signal lines, for receiving said coded input signals;

(1) said first circuit comprising:
 a. first gate means having a plurality of input terminals, said signal lines being connected to respective ones of said input terminals, said gate means also comprising an output terminal;
 b. first flip-flop means having two input terminals and an output terminal, said output terminal of said first gate means being connected to the first input terminal of said first flip-flop means;

(2) said second circuit comprising:
 a. second gate means having a plurality of input terminals connected to respective ones of said input lines, and having a first output terminal and a second output terminal;
 b. second flip-flop means having a first input terminal and a second input terminal and an output terminal, said first output terminal of said second gate means being connected to the first input terminal of said flip-flop, and said second output of said second gate means being connected to the second input terminal of said second flip-flop means;
 c. third gate means having a first input terminal and a second input terminal and an output terminal, the output terminal of said second gate means being connected to one input terminal of said fourth gate means, and the output terminal of said third gate means being connected to the other input terminal of said fourth gate means;

(3) and further including:
 a. fifth gate means having two input terminals and an output terminal, said output terminal of said first gate means being connected to one input terminal of said fifth gate means, and the output terminals of said fourth gate means being connected to the other input terminal of said fifth gate means, the output terminal of said fifth gate means being connected to the second input terminal of said first flip-flop means.

3. A converter for converting code words of a first coding system, representative of characters in the Arabic-Farsi languages, to other code words of a second coding system, said Arabic-Farsi language comprising special characters comprising an overdot and a respective undercharacter, said first coding system representing each of said special characters as a first code word representative of the overdot and a second code word representative of the respective one of the undercharacters;

said converter comprising:

means for recognizing the code words representative of the overdot;

means for converting any two code words determined to represent one of said special characters to a single code word of the second coding system; and analyzing means to analyze a code word following an overdot code word to determine if the following code word and the overdot code word are together representative of a special character.

4. A converter for converting code words of a first coding system, representing alphabetic characters of a language, to other code words of a second coding system, said language having special characters comprising combinations consisting of modifying symbols for respective ones of said characters together with said respective characters, said first coding system representing each said special character as two code words, a first code word for said character and a second code word for said modifying symbol;

said converter comprising:

means for recognizing the code words representative of said special characters by recognizing the code words representative of said modifying symbols;

means for converting any two code words determined to be representative of a respective one of the special characters to a single code word of the second coding system; and analyzing means to analyze a code word following the code word for a modifying symbol to determine if the following code word and the code word for the modifying symbol are together representative of a special character.

* * * * *